US009293516B2

(12) United States Patent
Choi et al.

(10) Patent No.: US 9,293,516 B2
(45) Date of Patent: Mar. 22, 2016

(54) DISPLAY DEVICE

(71) Applicant: SAMSUNG DISPLAY CO., LTD., Yongin-si, Gyeonggi-Do (KR)

(72) Inventors: Deok-Young Choi, Hwaseong-si (KR); Wang-Jo Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/328,242

(22) Filed: Jul. 10, 2014

(65) Prior Publication Data
US 2015/0187859 A1    Jul. 2, 2015

(30) Foreign Application Priority Data
Dec. 27, 2013  (KR) ................. 10-2013-0165534

(51) Int. Cl.
| H01L 27/14 | (2006.01) |
| H01L 29/04 | (2006.01) |
| H01L 29/15 | (2006.01) |
| H01L 31/036 | (2006.01) |
| H01L 27/32 | (2006.01) |
| G02F 1/1368 | (2006.01) |
| G02F 1/1362 | (2006.01) |

(52) U.S. Cl.
CPC .......... *H01L 27/3276* (2013.01); *G02F 1/1368* (2013.01); *G02F 1/136213* (2013.01); *H01L 27/3216* (2013.01); *H01L 27/3262* (2013.01); *H01L 27/3265* (2013.01)

(58) Field of Classification Search
None
See application file for complete search history.

(56) References Cited

U.S. PATENT DOCUMENTS

| 2011/0267327 A1 | 11/2011 | Hwang |
| 2011/0291115 A1 | 12/2011 | Kim et al. |
| 2012/0026144 A1 | 2/2012 | Kang et al. |

FOREIGN PATENT DOCUMENTS

| KR | 10-2006-0016590 | 2/2006 |
| KR | 10-2011-0120570 | 11/2011 |
| KR | 10-2011-0131973 | 12/2011 |
| KR | 10-2012-0010824 | 2/2012 |

*Primary Examiner* — Sonya D McCall Shepard
(74) *Attorney, Agent, or Firm* — Lewis Roca Rothgerber Christie LLP

(57) ABSTRACT

A display device comprises a substrate, a first pixel on the substrate, the first pixel comprising a first subpixel, a second subpixel, and a third subpixel, a second pixel on the substrate, the second pixel comprising a fourth subpixel, a fifth subpixel, and a sixth subpixel, first, second, third and fourth power supply lines extending in one direction and respectively coupled to the first, third, fifth, and sixth subpixels, and fifth and sixth power supply lines crossing the first, second, third, and fourth power supply lines and respectively coupled to the fourth and second subpixels.

13 Claims, 8 Drawing Sheets

FIG. 2

| R | R | R | R | R | R | R | R |
|---|---|---|---|---|---|---|---|
| G | G | G | G | G | G | G | G |
| B | B | B | B | B | B | B | B |

DISPLAY DEVICE

CROSS-REFERENCE TO RELATED APPLICATION

This application claims priority to and the benefit of Korean Patent Application No. 10-2013-0165534, filed on Dec. 27, 2013, with the Korean Intellectual Property Office, the disclosure of which is incorporated herein in its entirety by reference.

BACKGROUND

1. Field

Embodiments of the present invention relate to a display device in which a driving voltage is supplied to red, green, and blue subpixels through two power supply lines.

2. Description of the Related Art

In general, flat panel displays (FPDs) such as liquid crystal display (LCD) and organic light emitting diode (OLED) display include a pair of electric field generating electrodes and an electro-optical active layer interposed therebetween. In the case of the LCD, a liquid crystal layer is included as the electro-optical active layer, and in the case of the OLED display, an organic light emitting layer is included as the electro-optical active layer.

One of the pair of electric field generating electrodes is generally coupled to a switching element so as to receive an electric signal. The electro-optical active layer converts the electric signal into an optical signal so that an image is displayed.

The FPDs use a thin film transistor (TFT), which is a three-terminal device, as the switching element, and may include signal lines such as a gate line to transmit scan signals in order to control the TFT and a data line to transmit signals to be applied to a pixel electrode.

However, recent display devices with large area and high integration result in IR drop, and the IR drop causes luminance non-uniformity of the display devices. For instance, in the case of digital driving, unlike analog driving, driving voltage is directly applied to a pixel electrode of the display device when a pixel emits light. Therefore, a variation of the driving voltage causes a variation of voltage of the pixel electrode of the display device, and this results in luminance non-uniformity of the display device. In the digital driving method, different voltages are supplied to a red subpixel, a green subpixel, and a blue subpixel in order to maintain uniform luminance. Accordingly, power supply lines are located in the red subpixel, the green subpixel, and the blue subpixel, respectively, such that the display device has a low aperture ratio.

SUMMARY

Aspects of embodiments of the present invention are directed to a display device. Further, aspects of embodiments of the present invention are directed to a display device in which two power supply lines are in a pixel including a red subpixel, a green subpixel, and a blue subpixel.

According to an embodiment of the present invention, a display device may include a substrate, a first pixel on the substrate, the first pixel comprising a first subpixel, a second subpixel, and a third subpixel, a second pixel on the substrate, the second pixel comprising a fourth subpixel, a fifth subpixel, and a sixth subpixel, first, second, third, and fourth power supply lines extending in one direction and respectively coupled to the first, third, fifth, and sixth subpixels, and fifth and sixth power supply lines crossing the first, second, third, and fourth power supply lines and respectively coupled to the fourth and second subpixels.

The display device may further include a gate line coupled to the first and second pixels, a data line crossing the gate line and coupled to the first and second pixels, and a switching transistor coupled to the gate line and the data line.

The gate line may be coupled to the first, second, third, fourth, fifth, and sixth subpixels.

The first, second, third, and fourth power supply lines may be on the same layer as the data line.

The fifth and sixth power supply lines may be on the same layer as the gate line.

The first subpixel may be a red subpixel, the second subpixel may be a green subpixel, and the third subpixel may be a blue subpixel.

The third subpixel may have a larger area than the first subpixel and the second subpixel.

The fourth subpixel may be a red subpixel, the fifth subpixel may be a green subpixel, and the sixth subpixel may be a blue subpixel.

The sixth subpixel may have a larger area than the fourth subpixel and the fifth subpixel.

The display device may further include a pattern configured to connect the first power supply line to the fifth power supply line.

The pattern may be a part of a storage electrode of the fourth subpixel.

The display device may further include a pattern configured to connect the sixth power supply line to the third power supply line.

The pattern is a part of a source electrode of a driving transistor of the second subpixel.

According to embodiments of the present invention, the display device may include two power supply lines in one pixel including red, green, and blue subpixels so that an aperture ratio may increase. The display device may further include a power supply line for the blue subpixel having a large amount of current so that IR drop may be reduced, and has a power mesh structure in which the power supply lines intersect each other so that the IP drop may be further reduced.

The foregoing summary is illustrative only and is not intended to be in any way limiting. In addition to the illustrative aspects, embodiments, and features described above, further aspects, embodiments, and features will become apparent by reference to the drawings and the detailed description which follows.

BRIEF DESCRIPTION OF THE DRAWINGS

The above and other features and aspects of embodiments of the present invention will be more clearly understood from the following detailed description taken in conjunction with the accompanying drawings, in which:

FIG. 2 is a schematic diagram illustrating an arrangement of a plurality of pixels in a display device according to an embodiment of the present invention;

DETAILED DESCRIPTION

Figure 1:
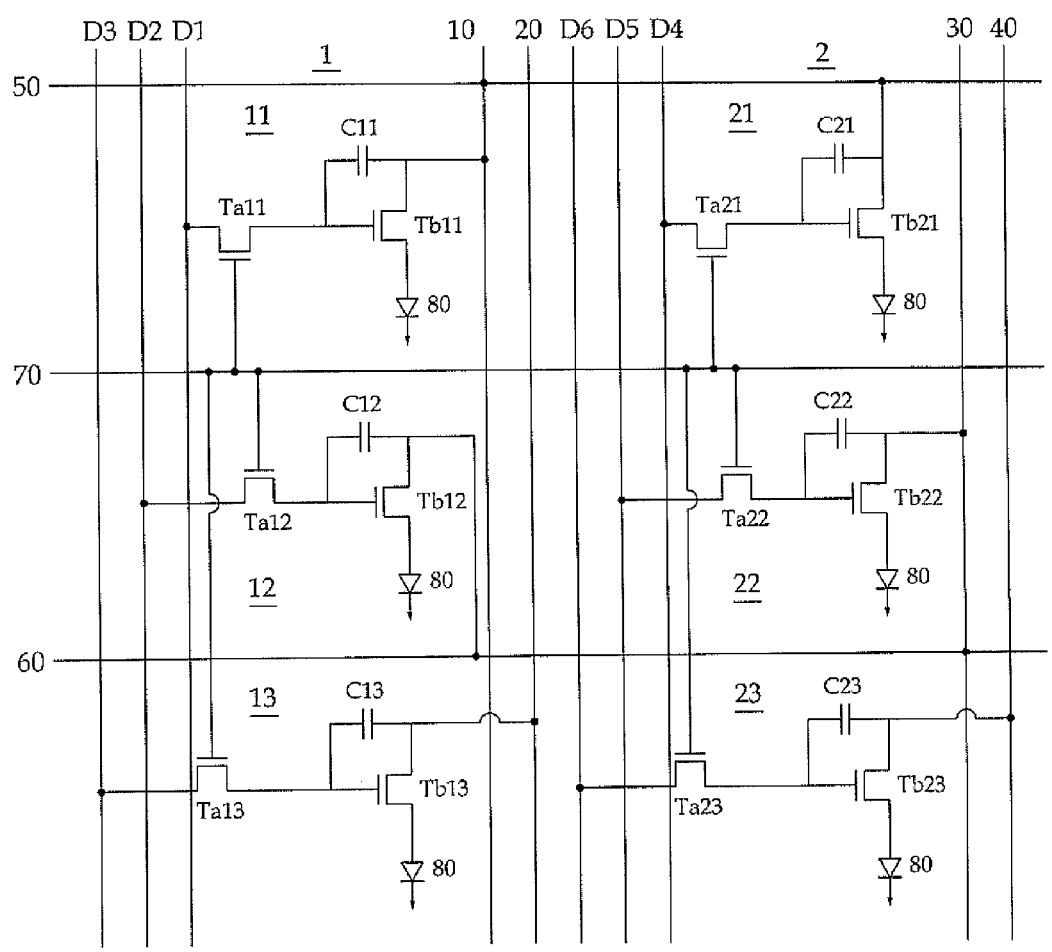
FIG. 1 is an equivalent circuit diagram of first and second pixels of a display device according to an embodiment of the present invention.

Features and aspects of the present invention and methods for achieving them will be made clear from the embodiments described below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is merely defined by the scope of the claims. Therefore, well-known constituent elements, operations and techniques are not described in detail in the embodiments in order to prevent the present invention from being obscurely interpreted. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in any other direction, and thus the spatially relative terms may be interpreted differently depending on the orientation.

The terminology used herein is for the purpose of describing particular embodiments only and should not be construed as limiting the invention. As used herein, the singular forms "a," "an" and "the" are intended to include the plural forms as well, unless the context clearly indicates otherwise. It will be further understood that the terms "comprises" and/or "comprising," when used in this specification, specify the presence of the mentioned component, step, operation and/or element, but do not exclude the presence or addition of one or more other components, steps, operations and/or elements.

Expressions such as "at least one of," when preceding a list of elements, modify the entire list of elements and do not modify the individual elements of the list. Further, the use of "may" when describing embodiments of the present invention refers to "one or more embodiments of the present invention." Expressions such as "coupled to" may also mean connected to, electrically coupled to, or electrically connected to. In addition, elements that are described as being "coupled to" one another may be directly coupled or indirectly coupled to one another.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the present specification.

Hereinafter, a display device according to embodiments of the present invention will be described in detail with reference to FIGS. 1 to 8. According to an embodiment of the present invention, the display device may be an organic light emitting diode (OLED) display or a liquid crystal display (LCD). Hereinafter, the embodiments of the present invention will be described with reference to an OLED display device.

Figure 2:
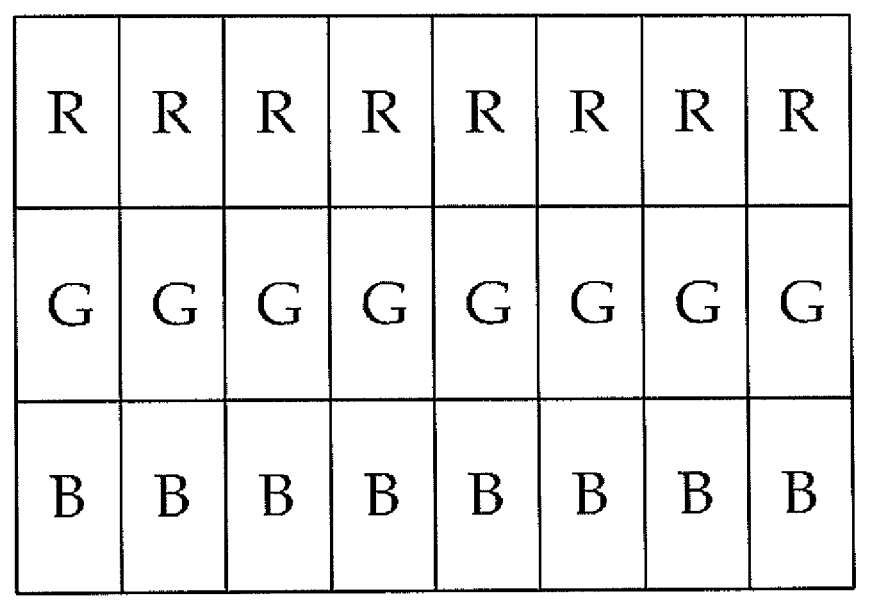
Figure 3:
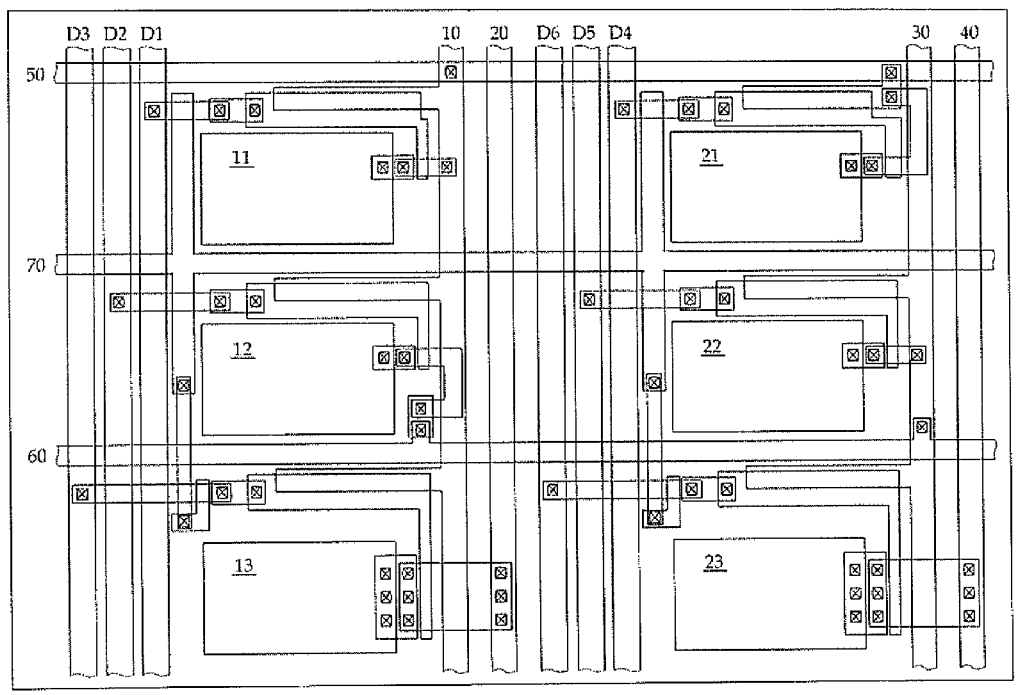
FIG. 3 is a schematic diagram illustrating first and second pixels of a display device according to an embodiment of the present invention.
Figure 4:
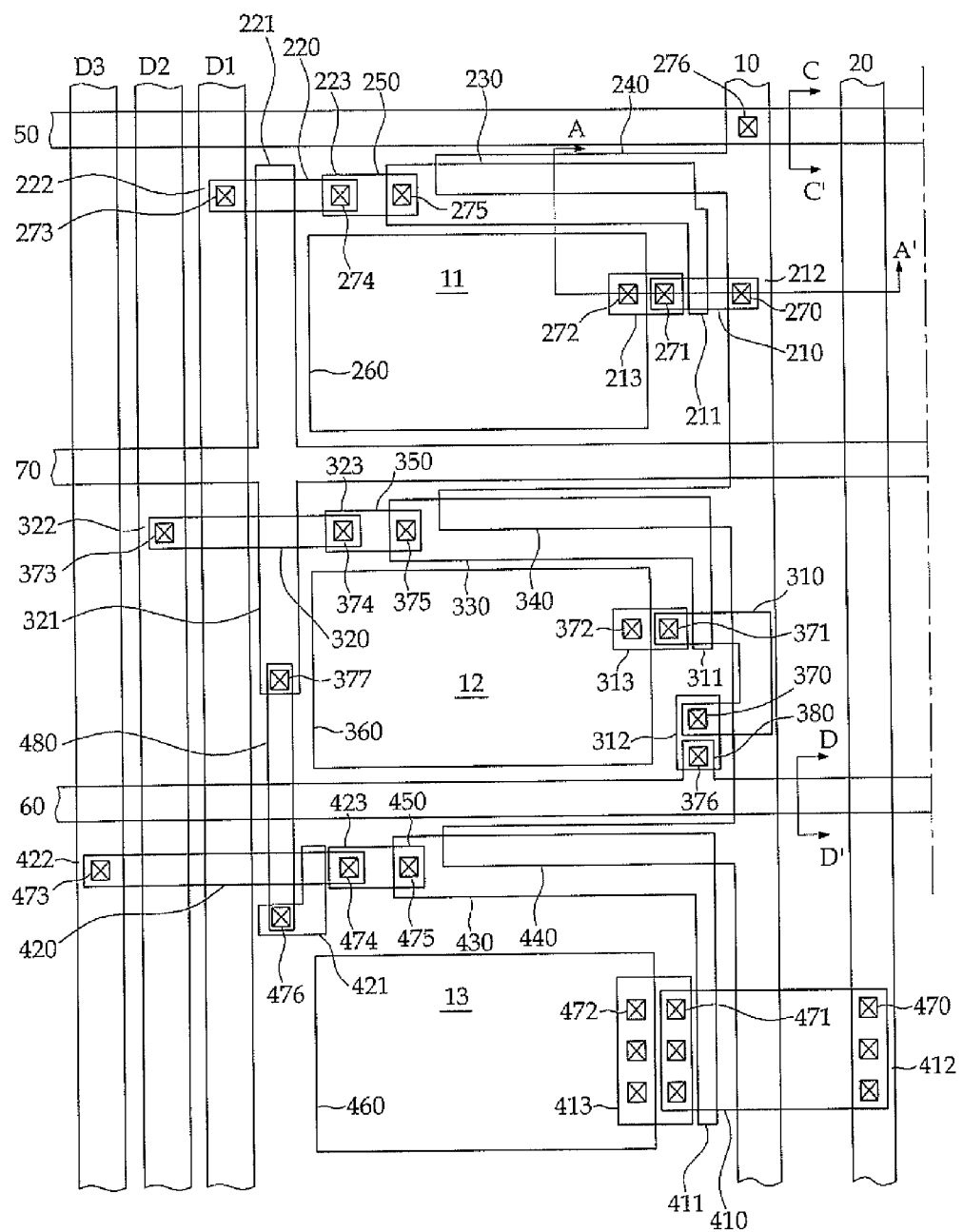
FIG. 4 is a diagram illustrating a first pixel of a display device according to an embodiment of the present invention.
Figure 5:
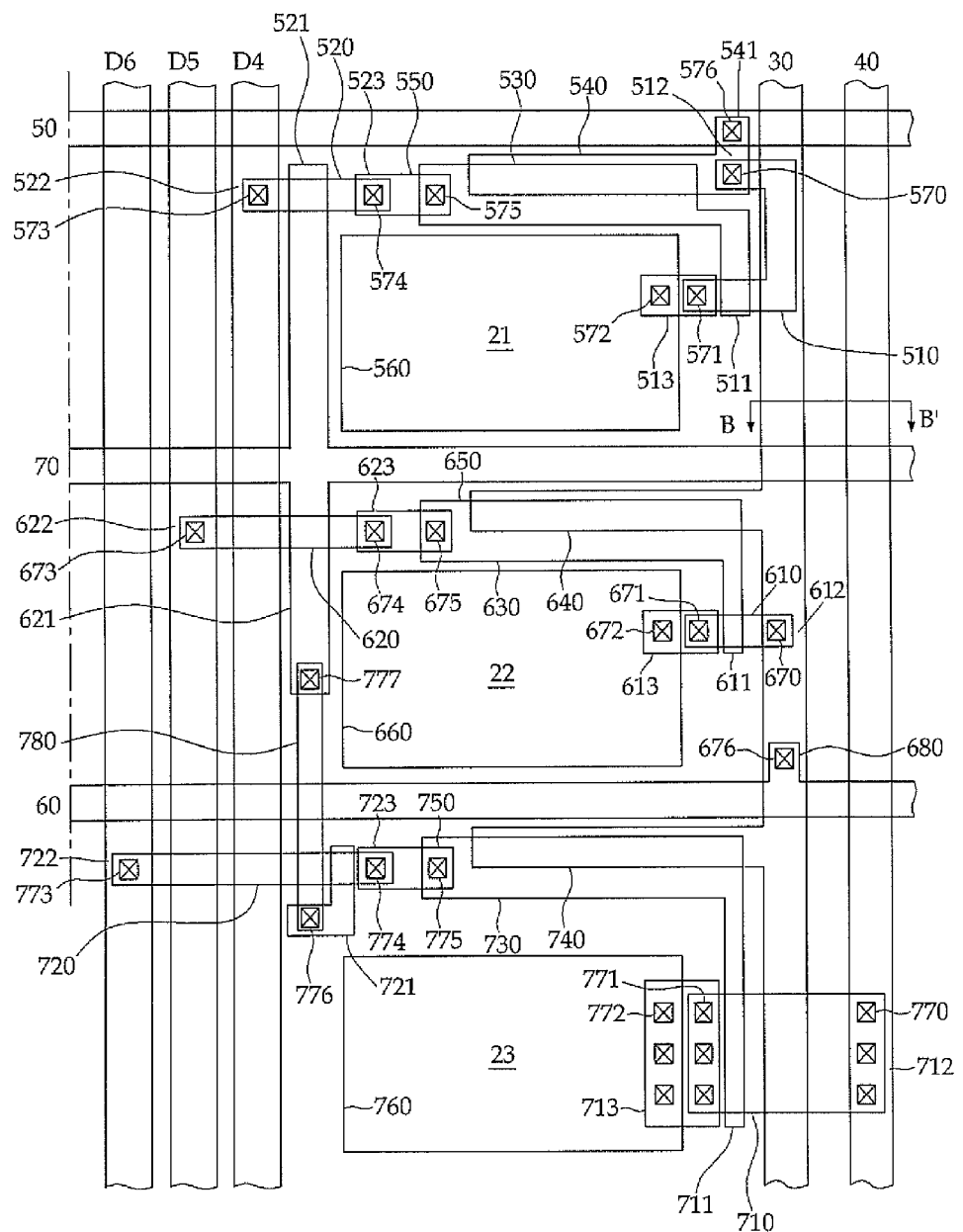
FIG. 5 is a diagram illustrating a second pixel of a display device according to an embodiment of the present invention.
Figure 6:
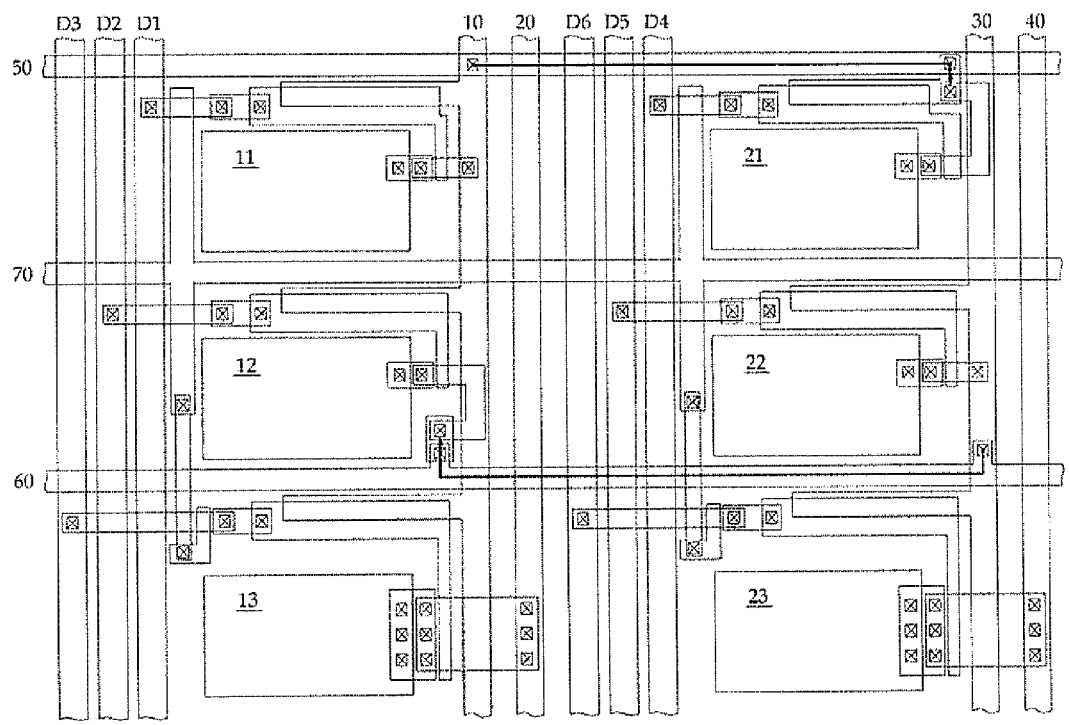
FIG. 6 is a schematic diagram illustrating a transmission path of a driving voltage of fifth and sixth power supply lines which are shown in FIG. 3.
Figure 7:
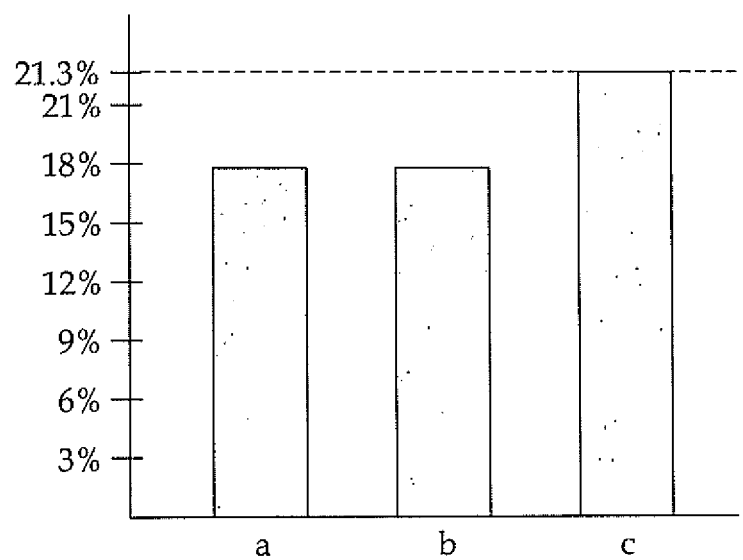
FIG. 7 is a diagram showing a comparison of an aperture ratio between a display device according to an embodiment of the present invention and a conventional display device.
Figure 8:
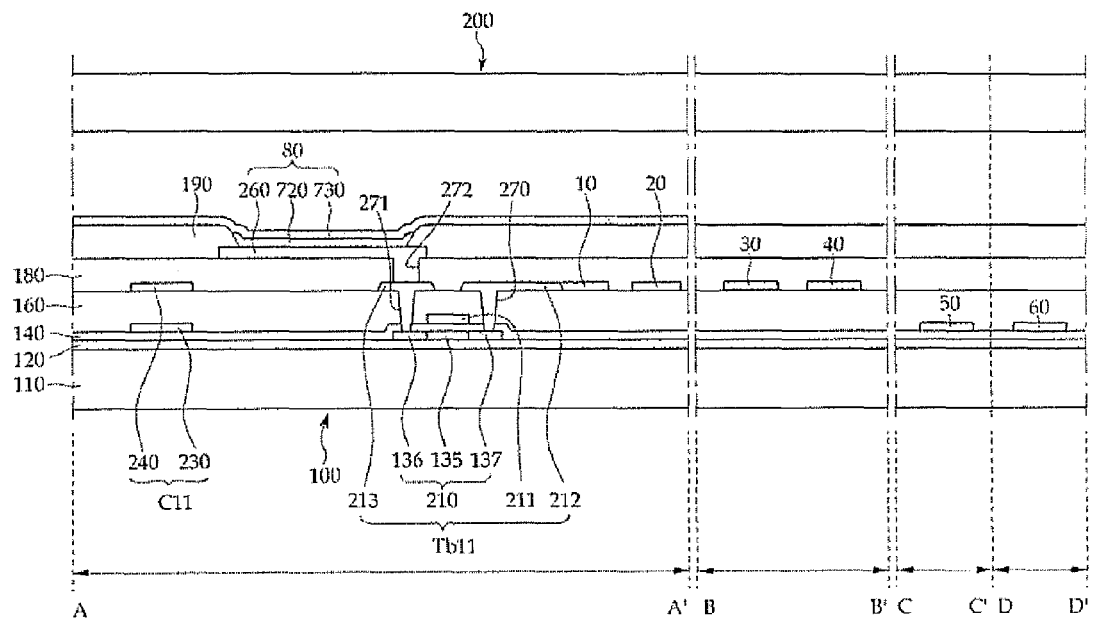
FIG. 8 is cross-sectional view of the display device, taken along the lines A-A', C-C', and D-D' of FIG. 4, and the line B-B' of FIG. 5.

FIG. 1 is an equivalent circuit diagram of first and second pixels of a display device according to an embodiment of the present invention. FIG. 2 is a schematic diagram illustrating an arrangement of a plurality of pixels in a display device according to an embodiment of the present invention. FIG. 3 is a schematic diagram illustrating first and second pixels of a display device according to an embodiment of the present invention. FIG. 4 is a diagram illustrating a first pixel of a display device according to an embodiment of the present invention. FIG. 5 is a diagram illustrating a second pixel of a display device according to an embodiment of the present invention. FIG. 6 is a schematic diagram illustrating a transmission path of a driving voltage of fifth and sixth power supply lines which are shown in FIG. 3. FIG. 7 is a diagram showing a comparison of an aperture ratio between a display device according to an embodiment of the present invention and a conventional display device. FIG. 8 is cross-sectional views of the display device, taken along the lines A-A', C-C', and D-D' of FIG. 4, and the line B-B' of FIG. 5.

As illustrated in FIG. 1, according to an embodiment of the present invention, the OLED display includes a plurality of signal lines D1, D2, D3, D4, D5, D6, 10, 20, 30, 40, 50, 60, and 70, and a plurality of pixels PX coupled to the plurality of signal lines and generally arranged (e.g., arranged) in a matrix form.

The plurality of pixels PX include a first pixel 1 and a second pixel 2. The first pixel 1 includes a first subpixel 11, a second subpixel 12, and a third subpixel 13. The second pixel 2 includes a fourth subpixel 21, a fifth subpixel 22, and a sixth subpixel 23.

The plurality of signal lines includes a gate line 70 configured to transmit a gate signal (or scan signal), a plurality of data lines D1, D2, D3, D4, D5, and D6 configured to transmit data signals, and a plurality of power supply lines 10, 20, 30, 40, 50, and 60 configured to transmit driving voltages. The gate line 70, the fifth power supply line 50, and the sixth power supply line 60 extend generally in a row direction and are substantially parallel (e.g., parallel) to each other. The data lines D1, D2, D3, D4, D5, and D6, the first power supply line 10, the second power supply line 20, the third power supply line 30, and the fourth power supply line 40 extend generally in a column direction and are substantially parallel (e.g., parallel) to each other.

Each pixel PX includes switching thin film transistors (TFTs) Ta11, Ta12, Ta13, Ta21, Ta22, and Ta23, driving TFTs Tb11, Tb12, Tb13, Tb21, Tb22, and Tb23, storage capacitors C11, C12, C13, C21, C22, and C23, and an organic light emitting diode (OLED) 80.

The switching TFTs Ta11, Ta12, Ta13, Ta21, Ta22, and Ta23 have a control terminal, an input terminal, and an output terminal, and the control terminal is coupled to the gate line 70, the input terminal is coupled to the data lines D1, D2, D3, D4, D5, and D6, and the output terminal is coupled to the driving TFTs Tb11, Tb12, Tb13, Tb21, Tb22, and Tb23. The switching TFTs Ta11, Ta12, Ta13, Ta21, Ta22, and Ta23 are configured to transmit the data signals applied to the data lines D1, D2, D3, D4, D5, and D6 to the driving TFTs Tb11, Tb12, Tb13, Tb21, Tb22, and Tb23 in response to the scan signal applied to the gate line 70.

The driving TFTs Tb11, Tb12, Tb13, Tb21, Tb22, and Tb23 have a control terminal, an input terminal, and an output terminal, and the control terminal is coupled to the switching TFTs Ta11, Ta12, Ta13, Ta21, Ta22, and Ta23, the input terminal is coupled to the power supply lines 10, 20, 30, 40, 50, and 60, and the output terminal is coupled to the OLED 80. The driving TFTs Tb11, Tb12, Tb13, Tb21, Tb22, and Tb23 are configured to allow an output current (not shown), of which magnitude varies depending on a voltage between the control terminal and the output terminal, to flow.

The storage capacitors C11, C12, C13, C21, C22, and C23 are connected between the control and input terminals of the driving TFTs Tb11, Tb12, Tb13, Tb21, Tb22, and Tb23. The storage capacitors C11, C12, C13, C21, C22, and C23 are configured to charge the data signal applied to the control terminal of the driving TFTs Tb11, Tb12, Tb13, Tb21, Tb22, and Tb23, and are configured to maintain the charging of the data signal after the switching TFTs Ta11, Ta12, Ta13, Ta21, Ta22, and Ta23 are turned off.

The OLED 80 has an anode coupled to the output terminal of the driving TFTs Tb11, Tb12, Tb13, Tb21, Tb22, and Tb23, and a cathode coupled to a common voltage. The OLED 80 emits light by changing light intensity according to the output current of the driving TFTs Tb11, Tb12, Tb13, Tb21, Tb22, and Tb23 so that an image is displayed.

The switching TFTs Ta11, Ta12, Ta13, Ta21, Ta22, and Ta23 and the driving TFTs Tb11, Tb12, Tb13, Tb21, Tb22, and Tb23 are n-channel field effect transistors (FETs). However, at least one of the switching TFTs Ta11, Ta12, Ta13, Ta21, Ta22, and Ta23 and the driving TFTs Tb11, Tb12, Tb13, Tb21, Tb22, and Tb23 may be p-channel FETs. In addition, connections between the TFTs Ta11, Ta12, Ta13, Ta21, Ta22, Ta23, Tb11, Tb12, Tb13, Tb21, Tb22, and Tb23 and connections between the storage capacitors C11, C12, C13, C21, C22, and C23 and the OLED 80 may be changed. In other words, embodiments of the present invention are not limited to the specific connections shown and described.

Referring to FIGS. 1 and 2, the first subpixel 11, the second subpixel 12, and the third subpixel 13 are alternately arranged in the first column of the OLED display according to an embodiment of the present invention. The fourth subpixel 21, the fifth subpixel 22, and the sixth subpixel 23 are alternately arranged in the second column adjacent to the first column. The first subpixel 11 and the fourth subpixel 21 may be red subpixels R configured to display a red color, the second subpixel 12 and the fifth subpixel 22 may be green subpixels G configured to display a green color, and the third subpixel 13 and the sixth subpixel 23 may be blue subpixels B configured to display a blue color. Six pixels including the two red subpixels R, the two green subpixels G, and the two blue subpixels B compose one group and are iteratively arranged along the row (e.g., each row of a plurality of rows).

Further, the pixels arranged in the same row represent the same color. The red subpixels R are arranged in a first row, the green subpixels G are arranged in a second row and, the blue subpixels B are arranged in a third row.

The connection configuration of the pixels PX is as described above according to an embodiment of the present invention. The connection configuration will be described below in more detail according to the first, second, third, fourth, fifth, and sixth subpixels 11, 12, 13, 21, 22, and 23.

The first power supply line 10 is configured to supply the driving voltage to the red subpixels R, the third power supply line 30 is configured to supply the driving voltage to the green subpixels G, and the second and fourth power supply lines 20 and 40 are configured to supply the driving voltage to the blue subpixels B. The fifth power supply line 50 is coupled to the first power supply line 10 so as to supply the driving voltage to the red subpixels R, or to supply the driving voltage to the red subpixels R independently. Hence, in one embodiment, the fifth power supply line 50 is coupled to the first power supply line 10. In another embodiment the fifth power supply line 50 is not coupled to the first power supply line 10. The sixth power supply line 60 may be coupled to the third power supply line 30 so as to supply the driving voltage to the green subpixels G, or may supply the driving voltage to the green subpixels G independently. Hence, in one embodiment, the sixth power supply line 60 is coupled to the third power supply line 30. In another embodiment the sixth power supply line 60 is not coupled to the third power supply line 30. The voltage supplied by each power supply line is assumed as above, and will be described below regarding each subpixel.

The first, second, fourth, and fifth subpixels 11, 12, 21, and 22 may have the same area as each other, and the third and sixth subpixels 13 and 23 may have the same area as each other. The third and sixth subpixels 13 and 23 may have a larger area than the first, second, fourth, and fifth subpixels 11, 12, 21, and 22. In other words, the red and green subpixels R and G may be similar (e.g., identical) to each other in terms of area, and the blue subpixels B may be larger than the red and green subpixels R and G in area. The area of each pixel is assumed as above, and will be discussed below regarding each subpixel.

Referring to FIGS. 1, 3, 4, and 5, the first subpixel 11 may include the switching TFT Ta11, the driving TFT Tb11, the storage capacitor C11, and the OLED 80. The first subpixel 11 may be the red subpixel R.

The switching TFT Ta11 includes a switching semiconductor layer 220, a switching gate electrode 221, a switching source electrode 222, and a switching drain electrode 223. The switching source electrode 222 is coupled to a source region (not shown) of the switching semiconductor layer 220 through a fourth contact hole 273. The switching drain electrode 223 is coupled to a drain region (not shown) of the switching semiconductor layer 220 through a fifth contact hole 274. Meanwhile, the switching gate electrode 221 may have a shape of protruding from the gate line 70.

The driving TFT Tb11 includes a driving semiconductor layer 210, a driving gate electrode 211, a driving source electrode 212, and a driving drain electrode 213. The driving source electrode 212 is coupled to a source region (not shown) of the driving semiconductor layer 210 through a first contact hole 270. The driving drain electrode 213 is coupled to a drain region (not shown) of the driving semiconductor layer 210 through a second contact hole 271. Meanwhile, the driving source electrode 212 may have a shape of protruding from the first power supply line 10, or may be a part of the first power supply line 10.

The first subpixel 11 is coupled to the gate line 70, the first data line D1, and the first power supply line 10. The first power supply line 10 may be configured to supply the driving voltage to the red subpixel R that is the first subpixel 11.

As illustrated in FIG. 6, the first power supply line 10 is coupled to the fifth power supply line 50 through a first power supply line contact hole 276. Therefore, the first power supply line 10 is coupled to the fifth power supply line 50 so as to supply the driving voltage to the red subpixel R that is the fourth subpixel 21.

In greater detail, the switching source electrode 222 of the switching TFT Ta11 is coupled to the first data line D1, the switching gate electrode 221 is coupled to the gate line 70, and the switching TFT Ta11 may be configured to control the data signal transmitted through the first data line D1 in response to the gate signal transmitted through the gate line 70.

The driving drain electrode 213 of the driving TFT Tb11 is coupled to one electrode of the OLED 80, namely a pixel electrode 260, through a third contact hole 272, and the driving source electrode 212 of the driving TFT Tb11 is coupled to the first power supply line 10. The driving gate electrode 211 of the driving TFT Tb11 is coupled to the switching drain electrode 223 of the switching TFT Ta11 through the fifth contact hole 274, a sixth contact hole 275, and a connection member 250 so as to control a current flow of the driving source and drain electrodes 212 and 213 of the driving TFT Tb11 in response to voltage changes of input data signals, thereby controlling light intensity emitted by the OLED 80.

In other words, an end portion of the OLED 80 is coupled to the driving drain electrode 213 of the driving TFT Tb11 so as to emit light corresponding to a current amount according to a voltage difference between the driving gate and source electrodes 211 and 212 of the driving TFT Tb11.

A capacitor includes a first storage electrode 230 patterned in conjunction with the driving gate electrode 211, and a second storage electrode 240 protruding from the first power supply line 10 so that the storage capacitor C11 accumulates the driving voltage.

The second subpixel 12 includes the switching TFT Ta12, the driving TFT Tb12, the storage capacitor C12, and the OLED 80. The second subpixel 12 may be the green subpixel G.

The switching TFT Ta12 includes a switching semiconductor layer 320, a switching gate electrode 321, a switching source electrode 322, and a switching drain electrode 323. The switching source electrode 322 is coupled to a source region (not shown) of the switching semiconductor layer 320 through a fourth contact hole 373. The switching drain electrode 323 is coupled to a drain region (not shown) of the switching semiconductor layer 320 through a fifth contact hole 374. Meanwhile, the switching gate electrode 321 may have a shape of protruding from the gate line 70.

The driving TFT Tb12 includes a driving semiconductor layer 310, a driving gate electrode 311, a driving source electrode 312, and a driving drain electrode 313. The driving source electrode 312 is coupled to a source region (not shown) of the driving semiconductor layer 310 through a first contact hole 370. The driving drain electrode 313 is coupled to a drain region (not shown) of the driving semiconductor layer 310 through a second contact hole 371.

The second subpixel 12 is coupled to the gate line 70, the second data line D2, and the sixth power supply line 60. The sixth power supply line 60 is configured to supply the driving voltage to the green subpixel G that is the second subpixel 12.

The second subpixel 12 further includes a pattern configured to connect the sixth power supply line 60 to the third power supply line 30. In detail, the sixth power supply line 60 includes a first protrusion 380 and a second protrusion 680. The first protrusion 380 is coupled to the driving source electrode 312 through a sixth power supply line contact hole 376. The second protrusion 680 is coupled to the third power supply line 30 through a third power supply line contact hole 676. Therefore, the pattern may be a part of the driving source electrode 312 of the driving TFT Tb12 of the second subpixel 12, or may be the first protrusion 380.

As illustrated in FIG. 6, the sixth power supply line 60 is coupled to the third power supply line 30 so as to supply the driving voltage to the green subpixel G that is the second subpixel 12. The sixth power supply line 60 may not be coupled to the third power supply line 30, and may also supply the driving voltage to the green subpixel G independently. In this case, an end portion of the sixth power supply line 60 should be coupled to a power supply unit (not shown) configured to supply the driving voltage to the green subpixel G. Hence, in one embodiment, the sixth power supply line 60 is coupled to the third power supply line 30. In another embodiment, the sixth power supply line 60 is not be coupled to the third power supply line 30.

In greater detail, the switching source electrode 322 of the switching TFT Ta12 is coupled to the second data line D2, the switching gate electrode 321 is coupled to the gate line 70, and the switching TFT Ta12 may be configured to control the data signal transmitted through the second data line D2 in response to the gate signal transmitted through the gate line 70.

The driving drain electrode 313 of the driving TFT Tb12 is coupled to one electrode of the OLED 80, namely, a pixel electrode 360, through a third contact hole 372, and the driving source electrode 312 of the driving TFT Tb12 is coupled to the sixth power supply line 60. The driving gate electrode 311 of the driving TFT Tb12 is coupled to the switching drain electrode 323 of the switching TFT Ta11 through the fifth contact hole 374, a sixth contact hole 375, and a connection member 350 so as to control a current flow of the driving source and drain electrodes 312 and 313 of the driving TFT Tb12 in response to voltage changes of input data signals, thereby controlling light intensity emitted by the OLED 80.

In other words, an end portion of the OLED 80 is coupled to the driving drain electrode 313 of the driving TFT Tb12 so as to emit light corresponding to a current amount according to a voltage difference between the driving gate and source electrodes 311 and 312 of the driving TFT Tb12.

A capacitor includes a first storage electrode 330 patterned in conjunction with the driving gate electrode 311, and a second storage electrode 340 protruding from the first power supply line 10 so that the storage capacitor C12 accumulates the driving voltage.

The third subpixel 13 includes the switching TFT Ta13, the driving TFT Tb13, the storage capacitor C13, and the OLED 80. The third subpixel 13 may be the blue subpixel B.

The switching TFT Ta13 includes a switching semiconductor layer 420, a switching gate electrode 421, a switching source electrode 422, and a switching drain electrode 423. The switching source electrode 422 is coupled to a source region (not shown) of the switching semiconductor layer 420 through a fourth contact hole 473. The switching drain electrode 423 is coupled to a drain region (not shown) of the switching semiconductor layer 420 through a fifth contact hole 474. Meanwhile, the switching gate electrode 421 is coupled to the gate line 70 through a gate electrode contact hole 476, a gate line contact hole 377, and a gate line connection member 480.

The driving TFT Tb13 includes a driving semiconductor layer 410, a driving gate electrode 411, a driving source electrode 412, and a driving drain electrode 413. The driving source electrode 412 is coupled to a source region (not shown) of the driving semiconductor layer 410 through a first contact hole 470. The driving drain electrode 413 is coupled to a drain region (not shown) of the driving semiconductor layer 410 through a second contact hole 471. Meanwhile, the driving source electrode 412 may have a shape of protruding from the second power supply line 20, or may be a part of the second power supply line 20.

Meanwhile, the first and second contact holes 470 and 471, and a third contact hole 472 may be plurally provided depending on the size of the third subpixel 13 that is the blue subpixel.

The third subpixel 13 is coupled to the gate line 70, the third data line D3, and the second power supply line 20. The second power supply line 20 is configured to supply the driving voltage to the blue subpixel B that is the third subpixel 13.

In greater detail, the switching source electrode 422 of the switching TFT Ta13 is coupled to the third data line D3, the switching gate electrode 421 is coupled to the gate line 70, and the switching TFT Ta13 may be configured to control the data signal transmitted through the third data line D3 in response to the gate signal transmitted through the gate line 70.

The driving drain electrode 413 of the driving TFT Tb13 is coupled to one electrode of the OLED 80, namely a pixel electrode 460, through a third contact hole 472, and the driving source electrode 412 of the driving TFT Tb13 is coupled to the second power supply line 20. The driving gate electrode 411 of the driving TFT Tb13 is coupled to the switching drain electrode 423 of the switching TFT Ta13 through the fifth contact hole 474, a sixth contact hole 475, and a connection member 450 so as to control a current flow of the driving source and drain electrodes 412 and 413 of the driving TFT Tb13 in response to voltage changes of input data signals, thereby controlling light intensity emitted by the OLED 80.

In other words, an end portion of the OLED 80 is coupled to the driving drain electrode 413 of the driving TFT Tb13 so as to emit light corresponding to a current amount according to a voltage difference between the driving gate and source electrodes 411 and 412 of the driving TFT Tb13.

A capacitor includes a first storage electrode 430 patterned in conjunction with the driving gate electrode 411, and a second storage electrode 440 protruding from the first power supply line 10 so that the storage capacitor C13 accumulates the driving voltage.

The fourth subpixel 21 includes the switching TFT Ta21, the driving TFT Tb21, the storage capacitor C21, and the OLED 80. The fourth subpixel 21 may be the red subpixel.

The switching TFT Ta21 includes a switching semiconductor layer 520, a switching gate electrode 521, a switching source electrode 522, and a switching drain electrode 523. The switching source electrode 522 is coupled to a source region (not shown) of the switching semiconductor layer 520 through a fourth contact hole 573. The switching drain electrode 523 is coupled to a drain region (not shown) of the switching semiconductor layer 520 through a fifth contact hole 574. Meanwhile, the switching gate electrode 521 may have a shape of protruding from the gate line 70.

The driving TFT Tb21 includes a driving semiconductor layer 510, a driving gate electrode 511, a driving source electrode 512, and a driving drain electrode 513. The driving source electrode 512 is coupled to a source region (not shown) of the driving semiconductor layer 510 through a first contact hole 570. The driving drain electrode 513 is coupled to a drain region (not shown) of the driving semiconductor layer 510 through a second contact hole 571. Meanwhile, the driving source electrode 512 may have a shape of protruding from a second storage electrode 540, or may be a part of the second storage electrode 540.

The fourth subpixel 21 is coupled to the gate line 70, the fourth data line D4, and the fifth power supply line 50. The fifth power supply line 50 is configured to supply the driving voltage to the red subpixel R that is the fourth subpixel 21.

The fourth subpixel 21 further includes a pattern configured to connect the first power supply line 10 to the fifth power supply line 50. In detail, the fifth power supply line 50 is coupled to the first power supply line 10 through the first power supply line contact hole 276. The pattern may be a protrusion 541 of the second storage electrode 540 of the fourth subpixel 21.

As illustrated in FIG. 6, the fifth power supply line 50 is coupled to the protrusion 541 of the second storage electrode 540 through a fifth power supply line contact hole 576 so as to supply the driving voltage to the red subpixel R that is the driving source electrode 512 coupled to the protrusion 541 of the second storage electrode 540. The fifth power supply line 50 may not be coupled to the first power supply line 10, and may also supply the driving voltage to the red subpixel R independently. In this case, an end portion of the fifth power supply line 50 should be coupled to a power supply unit (not shown) configured to supply the driving voltage to the red subpixel R.

In greater detail, the switching source electrode 522 of the switching TFT Ta21 is coupled to the fourth data line D4, the switching gate electrode 521 is coupled to the gate line 70, and the switching TFT Ta21 is configured to control the data signal transmitted through the fourth data line D4 in response to the gate signal transmitted through the gate line 70.

The driving drain electrode 513 of the driving TFT Tb21 is coupled to one electrode of the OLED 80, namely a pixel electrode 560, through a third contact hole 572, and the driving source electrode 512 of the driving TFT Tb21 is coupled to the fifth power supply line 50. The driving gate electrode 511 of the driving TFT Tb21 is coupled to the switching drain electrode 523 of the switching TFT Ta21 through the fifth contact hole 574, a sixth contact hole 575, and a connection member 550 so as to control a current flow of the driving source and drain electrodes 512 and 513 of the driving TFT Tb21 in response to voltage changes of input data signals, thereby controlling light intensity emitted by the OLED 80.

In other words, an end portion of the OLED 80 is coupled to the driving drain electrode 513 of the driving TFT Tb21 so as to emit light corresponding to a current amount according to a voltage difference between the driving gate and source electrodes 511 and 512 of the driving TFT Tb21.

A capacitor includes a first storage electrode 530 patterned in conjunction with the driving gate electrode 511, and the second storage electrode 540 protruding from the third power supply line 30 so that the storage capacitor C21 accumulates the driving voltage.

The fifth subpixel 22 includes the switching TFT Ta22, the driving TFT Tb22, the storage capacitor C22, and the OLED 80. The fifth subpixel 22 may be the green subpixel G.

The switching TFT Ta22 includes a switching semiconductor layer 620, a switching gate electrode 621, a switching source electrode 622, and a switching drain electrode 623. The switching source electrode 622 is coupled to a source region (not shown) of the switching semiconductor layer 620 through a fourth contact hole 673. The switching drain electrode 623 is coupled to a drain region (not shown) of the switching semiconductor layer 620 through a fifth contact hole 674. Meanwhile, the switching gate electrode 621 may have a shape of protruding from the gate line 70.

The driving TFT Tb22 includes a driving semiconductor layer 610, a driving gate electrode 611, a driving source electrode 612, and a driving drain electrode 613. The driving source electrode 612 is coupled to a source region (not shown) of the driving semiconductor layer 610 through a first contact hole 670. The driving drain electrode 613 is coupled to a drain region (not shown) of the driving semiconductor layer 610 through a second contact hole 671.

The fifth subpixel 22 is coupled to the gate line 70, the fifth data line D5, and the third power supply line 30. The third power supply line 30 is configured to supply the driving voltage to the green subpixel G that is the fifth subpixel 22.

As illustrated in FIG. 6, the third power supply line 30 is coupled to the second protrusion 680 of the sixth power supply line 60 through the third power supply line contact hole 676. Therefore, the third power supply line 30 is coupled to the sixth power supply line 60 so as to supply the driving voltage to the green subpixel G that is the fifth subpixel 22.

In greater detail, the switching source electrode 622 of the switching TFT Ta22 is coupled to the fifth data line D5, the switching gate electrode 621 is coupled to the gate line 70, and the switching TFT Ta22 is configured to control the data signal transmitted through the fifth data line D5 in response to the gate signal transmitted through the gate line 70.

The driving drain electrode 613 of the driving TFT Tb22 is coupled to one electrode of the OLED 80, namely a pixel electrode 660, through a third contact hole 672, and the driving source electrode 612 of the driving TFT Tb22 is coupled to the third power supply line 30. The driving gate electrode 611 of the driving TFT Tb22 is coupled to the switching drain electrode 623 of the switching TFT Ta22 through the fifth contact hole 674, a sixth contact hole 675, and a connection member 650 so as to control a current flow of the driving source and drain electrodes 612 and 613 of the driving TFT Tb22 in response to voltage changes of input data signals, thereby controlling light intensity emitted by the OLED 80.

In other words, an end portion of the OLED 80 is coupled to the driving drain electrode 613 of the driving TFT Tb22 so as to emit light corresponding to a current amount according to a voltage difference between the driving gate and source electrodes 611 and 612 of the driving TFT Tb22.

A capacitor includes a first storage electrode 630 patterned in conjunction with the driving gate electrode 611, and a second storage electrode 640 protruding from the third power supply line 30 so that the storage capacitor C22 accumulates the driving voltage.

The sixth subpixel 23 includes the switching TFT Ta23, the driving TFT Tb23, the storage capacitor C23, and the OLED 80. The sixth subpixel 23 may be the blue subpixel.

The switching TFT Ta23 includes a switching semiconductor layer 720, a switching gate electrode 721, a switching source electrode 722, and a switching drain electrode 723. The switching source electrode 722 is coupled to a source region (not shown) of the switching semiconductor layer 720 through a fourth contact hole 773. The switching drain electrode 723 is coupled to a drain region (not shown) of the switching semiconductor layer 720 through a fifth contact hole 774. Meanwhile, the switching gate electrode 721 is coupled to the gate line 70 through a gate electrode contact hole 776, a gate line contact hole 777, and a gate line connection member 780.

The driving TFT Tb23 includes a driving semiconductor layer 710, a driving gate electrode 711, a driving source electrode 712, and a driving drain electrode 713. The driving source electrode 712 is coupled to a source region (not shown) of the driving semiconductor layer 710 through a first contact hole 770. The driving drain electrode 713 is coupled to a drain region (not shown) of the driving semiconductor layer 710 through a second contact hole 771. Meanwhile, the driving source electrode 712 may have a shape of protruding from the fourth power supply line 40, or may be a part of the fourth power supply line 40.

Meanwhile, the first and second contact holes 770 and 771, and a third contact hole 772 may be plurally provided depending on the size of the sixth subpixel 23 that is the blue subpixel.

The sixth subpixel 23 is coupled to the gate line 70, the sixth data line D6, and the fourth power supply line 40. The fourth power supply line 40 is configured to supply the driving voltage to the blue subpixel B that is the sixth subpixel 23.

In greater detail, the switching source electrode 722 of the switching TFT Ta23 is coupled to the sixth data line D6, the switching gate electrode 721 is coupled to the gate line 70, and the switching TFT Ta23 is configured to control the data signal transmitted through the sixth data line D6 in response to the gate signal transmitted through the gate line 70.

The driving drain electrode 713 of the driving TFT Tb23 is coupled to one electrode of the OLED 80, namely a pixel electrode 760, through a third contact hole 772, and the driving source electrode 712 of the driving TFT Tb23 is coupled to the fourth power supply line 40. The driving gate electrode 711 of the driving TFT Tb23 is coupled to the switching drain electrode 723 of the switching TFT Ta23 through the fifth contact hole 774, a sixth contact hole 775, and a connection member 750 so as to control a current flow of the driving source and drain electrodes 712 and 713 of the driving TFT Tb23 in response to voltage changes of input data signals, thereby controlling light intensity emitted by the OLED 80.

In other words, an end portion of the OLED 80 is coupled to the driving drain electrode 713 of the driving TFT Tb23 so as to emit light corresponding to a current amount according to a voltage difference between the driving gate and source electrodes 711 and 712 of the driving TFT Tb23.

A capacitor includes a first storage electrode 730 patterned in conjunction with the driving gate electrode 711, and a second storage electrode 740 protruding from the third power supply line 30 so that the storage capacitor C23 accumulates the driving voltage.

When the first pixel 1 and the second pixel 2 of the pixels PX are configured as described above, an aperture ratio can be improved and a voltage drop of the driving voltage can be reduced or prevented.

In detail, the first pixel 1 includes the first power supply line 10 configured to supply the driving voltage to the red subpixels R, and the second power supply line 20 configured to supply the driving voltage to the blue subpixels B. Therefore, one power supply line to supply the driving voltage to the green subpixels G is excluded from the first pixel 1 unlike a conventional pixel. The second pixel 2 includes the third power supply line 30 configured to supply the driving voltage to the green subpixels G, and the fourth power supply line 40 configured to supply the driving voltage to the blue subpixels B. Therefore, one power supply line to supply the driving voltage to the red subpixels R is excluded from the second pixel 2 unlike the conventional pixel. Previously, six power supply lines were used for each pixel PX, but according to an embodiment of the present invention, only four power supply lines are used for each pixel PX, thereby improving the aperture ratio.

Meanwhile, conventional gate lines are used as a power supply lines for the fifth power supply line 50 and the sixth power supply line 60. Further, gate signals are applied to the six subpixels through one gate line 70, and thus the aperture ratio is not lowered although the fifth and sixth power supply lines 50 and 60 are added.

A power supply line configured to supply the driving voltage for the blue subpixels B may be further provided to be substantially parallel (e.g., parallel) to the gate line 70. The power supply line configured to supply the driving voltage for the blue subpixels B may be properly located by considering the aperture ratio of a display device and the voltage drop of the driving voltage for the blue subpixels B.

Meanwhile, the power supply line, configured to supply the driving voltage for the blue subpixels B, is substantially parallel (e.g., parallel) to the gate line 70, and any one of the second power supply line 20 and the fourth power supply line 40, which are configured to supply the driving voltage for the blue subpixels B, may not be provided. In other words, one of the second power supply line 20 and the fourth power supply line 40 may be substantially parallel (e.g., parallel) to the gate line 70, and the other may remain unchanged. For instance, the second power supply line 20 may be substantially parallel (e.g., parallel) to the gate line 70, and may be coupled to the fourth power supply line 40. Therefore, the second power supply line 20 can supply the driving voltage for the blue subpixels of the fourth power supply line 40 to the third subpixel 13. That is, the second power supply line 20 functions in the same way as the fifth power supply line 50 or the sixth power supply line 60.

Referring to the bar chart of FIG. 7, bar a shows the case where one pixel including red, green, and blue subpixels receives the driving voltage through three power supply lines in the pixel. Bar b shows the case where one pixel including red, green, and blue subpixels receives the driving voltage through one power supply line in the pixel. Bar c shows an embodiment of the present invention.

In the case of bar a, the three power supply lines are in the red, green, and blue subpixels, respectively in a vertical direction, and thus the aperture ratio is 18% or less. In the case of bar b, the one power supply line is in the red, green, and blue subpixels in a vertical direction, but three power supply lines corresponding to the fifth power supply line 50 or the sixth power supply line 60 are further needed in a horizontal direction because power should be separately applied according to the color of the subpixel, and thus the aperture ratio is 18% or less as in bar a. In the case of bar c, two power supply lines are in the red, green, and blue subpixels in a vertical direction, and another two power supply lines are added in a horizontal direction by using the existing gate lines, and thus the aperture ratio is 21.3%, which is higher than the aperture ratio of bar a or b.

Further, the two power supply lines 20 and 40, configured to supply the driving voltage for the blue subpixels, are provided to allow a higher current to flow to the blue subpixels, and thus IR drop of the driving voltage is lowered as a whole. The fifth and sixth power supply lines 50 and 60 are further provided so that IR drop is further reduced.

Hereinafter, according to an embodiment of the present invention, the first subpixel 11, and the first, second, third, fourth, fifth, and sixth power supply lines 10, 20, 30, 40, 50 and 60 will be used as an example for a description with reference to FIGS. 3, 4, and 8. The switching TFT Ta11 of the first subpixel 11 may have the same laminated structure as the driving TFT Tb11, and thus further description thereof will not be provided. The TFT structure of the other subpixels 12, 13, 21, 22, and 23 may be similar (e.g., identical) to the TFT structure of the first subpixel 11 in terms of the laminated structure, and thus further description thereof will not be provided.

Referring to FIGS. 3, 4, and 8, the substrate 110 is an insulating substrate made of glass, quartz, ceramic, plastic, or the like, but embodiments of the present invention are not limited thereto. The substrate 110 may be a metal substrate made of stainless steel, etc., or the substrate 110 may be made of any other suitable material.

A buffer layer 120 is on the substrate 110. The buffer layer 120 prevents infiltration of impurities and planarizes a surface, and it may include a variety of materials that allow the above functions to perform. For instance, any one of a silicon nitride (SiNx) layer, a silicon oxide (SiOx) layer, and a silicon oxynitride (SiOxNy) layer may be used as the buffer layer 120. However, the buffer layer 120 is not necessarily on the substrate 110, and may be omitted according to kinds of the substrate 110 or manufacturing processes thereof.

The driving semiconductor layer 210 is on the buffer layer 120. The driving semiconductor layer 210 is made of any one of oxide semiconductors such as a polycrystalline silicon layer, an amorphous silicon layer, Indium-Gallium-Zinc Oxide (IGZO), and Indium-Zinc-Tin Oxide (IZTO). For example, in the case of the driving semiconductor layer 210 made of the polycrystalline silicon layer, the driving semiconductor layer 210 includes a channel area 135 that is not doped with impurities, and p+ doped drain and source areas 136 and 137 on both sides of the channel area 135. In this case, p-type impurities such as boron B are used as dopant ions, and $B_2H_6$ is generally used. Herein, such impurities vary depending on the kinds of the TFT.

According to an embodiment of the present invention, a PMOS-structured TFT using the p-type impurities is used as the TFT, but embodiments of the present invention are not limited thereto. A NMOS-structured or CMOS-structured TFT may also be used as the TFT. Further, the TFT may be a polycrystalline TFT, an amorphous TFT including an amorphous silicon layer, or an oxide semiconductor TFT.

A gate insulating layer 140 made of silicon nitride (SiNx) or silicon oxide (SiOx) is on the driving semiconductor layer 210. The gate insulating layer 140 may include at least one selected from the group consisting of tetraethyl orthosilicate (TEOS), silicon nitride (SiNx), silicon oxide (SiOx), and combinations thereof. For instance, the gate insulating layer 140 may have a double layer structure in which a silicon nitride layer having a thickness of about 40 nm and a TEOS layer having a thickness of about 80 nm are sequentially laminated, but the structure of the gate insulating layer 140 is not limited thereto.

The first storage electrode 230 including the driving gate electrode 211 and the gate line 70 are on the gate insulating layer 140. The gate line 70 further includes the switching gate electrodes 221 and 321, and other lines. The driving gate electrode 211 overlaps at least a part of the driving semiconductor layer 210, and in particular to overlap the channel area 135. The driving gate electrode 211 prevents the channel area 135 from being doped with impurities when the drain and source areas 136 and 137 of the driving semiconductor layer 210 are doped with the impurities in the process of forming the driving semiconductor layer 210.

The driving gate electrode 211 and the first storage electrode 230 are on the same layer, and are substantially made of the same metal material (e.g., are made of the same metal material). In this case, the metal material may include at least one material selected from the group consisting of molybdenum (Mo), chromium (Cr), tungsten (W), and combinations thereof. For example, the driving gate electrode 211 and the first storage electrode 230 may be made of molybdenum (Mo) or molybdenum alloys.

An interlayer insulating layer 160, configured to cover the driving gate electrode 211, is on the gate insulating layer 140. The gate insulating layer 140 and the interlayer insulating layer 160 have a first contact hole 270 to expose the source area 137 of the driving semiconductor layer 210, and a second contact hole 271 to expose the drain area 136 of the driving semiconductor layer 210. The interlayer insulating layer 160 may be made of tetraethyl orthosilicate (TEOS), silicon nitride (SiNx), or silicon oxide (SiOx) similar to the gate insulating layer 140, but embodiments of the present invention are not limited thereto.

The first power supply line 10 including the driving source electrode 212 and the second storage electrodes 240, 340, and 440, the second power supply line 20, the third power supply line 30 including the driving source electrode 612 and the second storage electrodes 540, 640, and 740, the fourth, fifth, and sixth power supply lines 40, 50, and 60, the data lines D1, D2, D3, D4, D5, and D6, the connection member 250, and the driving drain electrode 213 are on the interlayer insulating layer 160. The driving source electrode 212 and the driving drain electrode 213 are respectively coupled to the source area 137 and the drain area 136 of the driving semiconductor layer 210 through the contact holes 270 and 271.

The driving TFT Tb11 including the driving semiconductor layer 210, the driving gate electrode 211, the driving source electrode 212, and the driving drain electrode 213 is formed as described above. The capacitor C11 including the first storage electrode 230 and the second storage electrode 240 is also formed. In this case, the interlayer insulating layer 160 is a dielectric material of the capacitor C11.

The configuration of the TFTs Ta11 and Tb11 is not limited to the above-described embodiment, and may vary according to known configurations that can be easily carried out by those skilled in the art.

A planarization layer 180, configured to cover the data lines D1, D2, D3, D4, D5, and D6 and the power supply lines 10, 20, 30, 40, 50, and 60, is on the interlayer insulating layer 160. The planarization layer 180 serves to eliminate steps and planarize the OLED 80 in order to increase light emission efficiency of the OLED 80 on the planarization layer 180. The planarization layer 180 has a third contact hole 272 to expose a part of the driving drain electrode 213.

The planarization layer 180 may be made of at least one selected from the group consisting of a polyacrylate resin, an epoxy resin, a phenolic resin, a polyamide resin, a polyimide resin, an unsaturated polyester resin, a polyphenylenether resin, a polyphenylenesulfide resin, benzocyclobutene (BCB), and combinations thereof.

The pixel electrode 260 of the OLED 80 is on the planarization layer 180. Herein, the pixel electrode 260 serves as an anode. The pixel electrode 260 is coupled to the driving drain electrode 213 through the third contact hole 272 of the planarization layer 180.

A pixel defining layer (PDL) 190 having an opening to expose the pixel electrode 260 is on the planarization layer 180. That is, the pixel electrode 260 corresponds to the opening of the PDL 190. The PDL 190 may be made of polyacrylate resin or a polyimide resin.

An organic light emitting layer 720 is on the pixel electrode 260 in the opening of the PDL 190, and a common electrode 730 is on the PDL 190 and the organic light emitting layer 720.

The OLED 80 including the pixel electrode 260, the organic light emitting layer 720, and the common electrode 730 is formed as described above.

Any one of the pixel electrode 260 and the common electrode 730 may be made of a transparent conducting material, and the other may be made of a translucent or reflective conducting material. According to the kinds of materials included in the pixel electrode 260 and the common electrode 730, an OLED display may be classified into a top-emission type, a bottom-emission type, and a dual-emission type.

The transparent conducting material may include Indium Tin Oxide (ITO), Indium Zinc Oxide (IZO), zinc oxide (ZnO), or indium oxide ($In_2O_3$). The reflective material may include lithium (Li), Calcium (Ca), lithium fluoride/Calcium (LiF/Ca), lithium fluoride/aluminum (LiF/Al), aluminum (Al), silver (Ag), magnesium (Mg), or gold (Au).

The organic light emitting layer 720 may include a low molecular weight organic material or a high molecular weight organic material. Further, the organic light emitting layer 720 may be multilayer including a hole injection layer (HI), a hole transporting layer (HTL), a light emission layer, an electron transporting layer (ETL), and an electron injection layer (EIL). For example, the hole injection layer (HIL) is on the pixel electrode 260 serving as an anode, and the hole transporting layer (HTL), the light emission layer, the electron transporting layer (ETL), and the electron injection layer (EIL) are sequentially laminated on the hole injection layer (HIL).

An encapsulation substrate 200 is on the OLED 80. The encapsulation substrate 200 is opposite the substrate 110 so as to cover the TFT and the OLED 80. The encapsulation substrate 200 may be a transparent insulating substrate made of glass, quartz, or ceramic similar to the substrate 110. Further, the encapsulation substrate 200 may be a sealing member, and may have a thin film structure in which an organic layer and an inorganic layer are alternately laminated.

Meanwhile, in the case of a liquid crystal display (LCD), the pixel electrode 260 is physically and electrically coupled to the driving drain electrode 213 through the third contact hole 272, and may receive data voltage from the driving drain electrode 213. The pixel electrode 260 receiving the data voltage generates an electric field, together with the common electrode 730 (not shown) on another display substrate (not shown) receiving common voltage, thereby determining a direction of liquid crystal molecules of a liquid crystal layer (not shown) between the two electrodes. The pixel electrode 260 and the common electrode form a capacitor (e.g., a liquid crystal capacitor) so as to maintain the applied voltage after the TFT is turned off.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims, and equivalents thereof.

What is claimed is:

1. A display device comprising:
    a substrate;
    a first pixel on the substrate, the first pixel comprising a first subpixel, a second subpixel, and a third subpixel;
    a second pixel on the substrate, the second pixel comprising a fourth subpixel, a fifth subpixel, and a sixth subpixel;
    first, second, third, and fourth power supply lines extending in one direction and respectively coupled to the first, third, fifth, and sixth subpixels; and
    fifth and sixth power supply lines crossing the first, second, third, and fourth power supply lines and respectively coupled to the fourth and second subpixels.

2. The display device of claim 1, further comprising:
    a gate line coupled to the first and second pixels;
    a data line crossing the gate line and coupled to the first and second pixels; and
    a switching transistor coupled to the gate line and the data line.

3. The display device of claim 2, wherein the gate line is coupled to the first, second, third, fourth, fifth, and sixth subpixels.

4. The display device of claim 2, wherein the first, second, third, and fourth power supply lines are on a same layer as the data line.

5. The display device of claim 2, wherein the fifth and sixth power supply lines are on a same layer as the gate line.

6. The display device of claim 1, wherein the first subpixel is a red subpixel, the second subpixel is a green subpixel, and the third subpixel is a blue subpixel.

7. The display device of claim 1, wherein the third subpixel has a larger area than the first subpixel and the second subpixel.

8. The display device of claim 1, wherein the fourth subpixel is a red subpixel, the fifth subpixel is a green subpixel, and the sixth subpixel is a blue subpixel.

9. The display device of claim 1, wherein the sixth subpixel has a larger area than the fourth subpixel and the fifth subpixel.

10. The display device of claim 1, further comprising a pattern configured to couple the first power supply line to the fifth power supply line.

11. The display device of claim 10, wherein the pattern is a part of a storage electrode of the fourth subpixel.

12. The display device of claim 1, further comprising a pattern configured to couple the sixth power supply line to the third power supply line.

13. The display device of claim 12, wherein the pattern is a part of a source electrode of a driving transistor of the second subpixel.

* * * * *